United States Patent
Degen et al.

(10) Patent No.: US 11,293,940 B2
(45) Date of Patent: Apr. 5, 2022

(54) SCANNING SENSOR HAVING A SPIN DEFECT

(71) Applicant: ETH Zurich, Zurich (CH)

(72) Inventors: Christian Degen, Zurich (CH); Jens Boss, Lucerne (CH); Kevin Chang, Zurich (CH); Jan Rhensius, Dubendorf (CH)

(73) Assignee: ETH Zurich, Zurich (CH)

( * ) Notice: Subject to any disclaimer, the term of this patent is extended or adjusted under 35 U.S.C. 154(b) by 179 days.

(21) Appl. No.: 16/492,259

(22) PCT Filed: Mar. 14, 2018

(86) PCT No.: PCT/EP2018/056327
§ 371 (c)(1),
(2) Date: Sep. 9, 2019

(87) PCT Pub. No.: WO2018/167115
PCT Pub. Date: Sep. 20, 2018

(65) Prior Publication Data
US 2021/0140996 A1 May 13, 2021

(30) Foreign Application Priority Data
Mar. 16, 2017 (EP) .................................... 17161281

(51) Int. Cl.
*G01Q 20/04* (2010.01)
*G01Q 60/52* (2010.01)
*G01Q 70/14* (2010.01)

(52) U.S. Cl.
CPC ............. *G01Q 20/04* (2013.01); *G01Q 60/52* (2013.01); *G01Q 70/14* (2013.01)

(58) Field of Classification Search
CPC ......... G01Q 20/04; G01Q 70/14; G01Q 60/52
See application file for complete search history.

(56) References Cited

U.S. PATENT DOCUMENTS 5,861,624 A * 1/1999 Alexander ............. G01Q 60/38
850/6
7,571,638 B1 * 8/2009 Kley ...................... G01Q 60/38
73/105

(Continued)

FOREIGN PATENT DOCUMENTS

WO 2014051886 A1 4/2014
WO 2016083140 A1 6/2016

OTHER PUBLICATIONS

Acosta et al., "Temperature dependence of the nitrogen-vacancy magnetic resonance in diamond", Phys. Rev. Lett., 2010, pp. 070801-070805, vol. 104.
Degen, "Scanning magnetic field microscope with a diamond single-spin sensor", Appl. Phys. Lett., 2008, pp. 243111-1-243111-3, vol. 92.

(Continued)

*Primary Examiner* — Brooke Purinton
(74) *Attorney, Agent, or Firm* — The Webb Law Firm

(57) ABSTRACT

A sensor device includes a carrier, a force feedback sensor, and a probe containing a spin defect, the probe being connected to the force feedback sensor either directly or indirectly via a handle structure. In order to couple the spin defect to a microwave field in an efficient and robust manner, the sensor device includes an integrated microwave antenna arranged at a distance of less than 500 micrometers from the spin defect. The sensor device can be configured as a self-contained exchangeable cartridge that can easily be mounted in a sensor mount of a scanning probe microscope.

19 Claims, 8 Drawing Sheets

(56) References Cited

U.S. PATENT DOCUMENTS

| | | | | |
|---|---|---|---|---|
| 10,466,312 B2* | 11/2019 | Egan | ............... | G01R 33/032 |
| 10,962,611 B2* | 3/2021 | Barry | ............... | G01R 33/032 |
| 2008/0082093 A1* | 4/2008 | Prakash | ............... | A61B 18/14 |
| | | | | 606/33 |
| 2009/0265819 A1* | 10/2009 | Watanabe | ............... | B82Y 35/00 |
| | | | | 850/21 |
| 2014/0191139 A1* | 7/2014 | Englund | ............... | G01N 21/6458 |
| | | | | 250/459.1 |
| 2015/0090033 A1* | 4/2015 | Budker | ............... | G01R 33/46 |
| | | | | 73/504.05 |
| 2015/0253355 A1* | 9/2015 | Grinolds | ............... | G01R 33/60 |
| | | | | 850/40 |
| 2020/0088762 A1* | 3/2020 | Zhou | ............... | G01Q 60/08 |

OTHER PUBLICATIONS

Dmitriev et al., "Concept of a microscale vector magnetic field sensor based on nitrogen-vacancy centers in diamond", Journal of the Optical Society of America B, 2016, pp. B1-B-4, vol. 33, No. 3.

Dolde et al., "Sensing electric fields using single diamond spins", Nature Physics, 2011, pp. 459-463, vol. 7.

Schirhagl, et al., "Nitrogen-vacancy centers in diamond: Nanoscale sensors for physics and biology", Annu. Rev. Phys. Chem., 2014, pp. 83-105, vol. 65.

Schonfeld, "Optical readout of single spins for quantum computing and magnetic sensing", Dissertation, Fachbereich Phyik der Freien Universitat Berlin, 2011, pp. 1-143.

Yang, L-L et al. "Design and Application of a Near Field Microwave Antenna for the Spin Control of Nitrogen-Vacancy Centers", Chinese Physics Letters, 2010, pp. 038401-1-038401-4, vol. 27, No. 3.

* cited by examiner

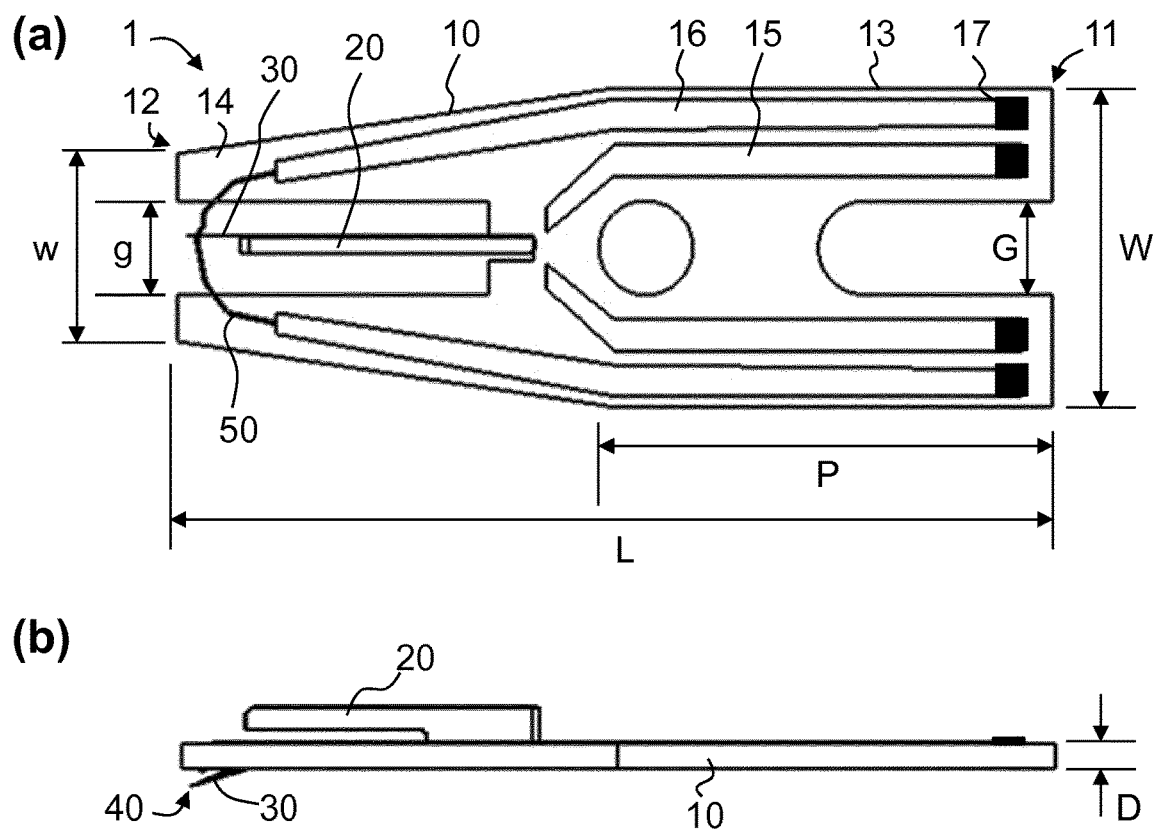
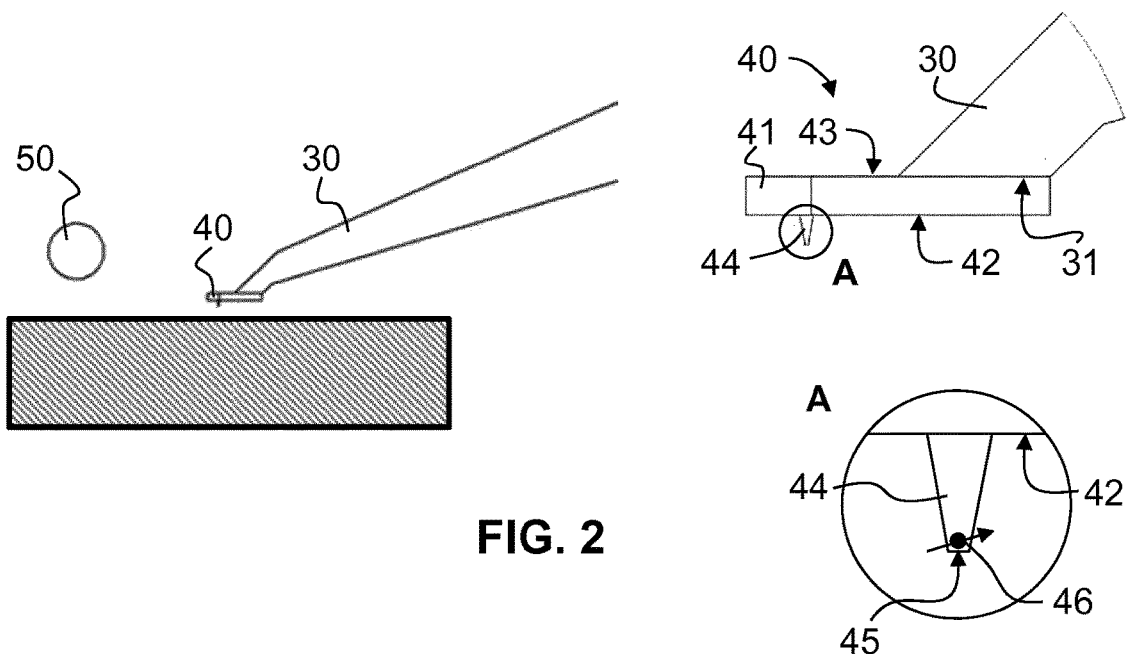
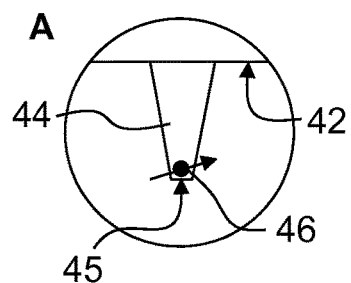
FIG. 1
FIG. 2
FIG. 3

SCANNING SENSOR HAVING A SPIN DEFECT

CROSS-REFERENCE TO RELATED APPLICATIONS

This application is the United States national phase of International Application No. PCT/EP2018/056327 filed Mar. 14, 2018, and claims priority to European Patent Application No. 17 161 281.5 filed Mar. 16, 2017, the disclosures of which are hereby incorporated by reference in their entirety.

BACKGROUND OF THE INVENTION

Field of the Invention

The present invention relates to a sensor device having a probe with a spin defect, in particular a diamond probe having a spin defect in the form of a nitrogen-vacancy (NV) center. The sensor device can be employed in a scanning probe microscope for probing magnetic, electric or other properties of a sample with high sensitivity and high spatial resolution by carrying out optically detected magnetic resonance (ODMR) experiments on the spin defect and scanning the probe over a sample surface. The present invention further relates to a scanning probe microscope having such a sensor device, and to a method of optically detecting magnetic resonance using such a scanning probe microscope.

Description of Related Art

PRIOR ART

The ability to measure and analyze weak magnetic fields with high spatial resolution is of key importance to nanoscale materials science. For example, the imaging of stray fields from small ferromagnetic structures, such as magnetic domains, particles, and junctions is immensely helpful for the development of next-generation data storage media and spintronic devices. The imaging of stray fields further offers a means to study novel emerging materials and phases, including skyrmions, ferroelectrics, complex oxides, and topological insulators. In addition, nanoscale magnetic measurements can be used to map the two-dimensional current density in nanoscale conductors, with applications to semiconductor physics, integrated circuits, and thin photoactive films in energy research. Unfortunately, despite considerable effort, measurements of weak magnetic fields with nanometer spatial resolution are very challenging and are still insufficiently supported by presently available technology.

WO 2014/051886 A1 suggests employing a scanning force microscopy setup to scan a sensing probe comprising an NV center over a surface. The spin state is polarized by laser light. The spin state of the NV center is manipulated by microwave radiation. Fluorescent light from the NV center is detected with an optical microscope. In this manner, the NV defect acts as a probe for magnetic fields, electric fields and/or temperature with high spatial resolution. The document is silent about the manner in which the NV center is coupled to the microwave radiation.

A. L. Dmitriev et al., "Concept of a microscale vector magnetic field sensor based on nitrogen-vacancy centers in diamond", Journal of the Optical Society of America B, Vol. 33, No. 3 (March 2016) discloses a magnetic field sensor comprising a small diamond crystal affixed to the end of an optical fiber for exciting the NV center and for detecting fluorescent light emitted from the NV center. A microwave antenna is wound around the optical fiber to couple a microwave field to the NV center. The document is silent about the manner in which the magnetic field sensor may be positioned in space. In particular, the document does not suggest scanning the magnetic field sensor over a surface.

SUMMARY OF THE INVENTION

It is an object of the present invention to provide a sensor device comprising a probe with a spin defect, the sensor device being configured for imaging properties that may influence a spin state of the spin defect, in particular of magnetic or electric fields, with high spatial resolution, wherein the sensor device is configured in such a manner that a microwave field can be coupled to the spin defect in a simple, robust and efficient manner.

The present invention provides a sensor device comprising a carrier, a force feedback sensor connected to the carrier, and a probe containing a spin defect (wherein either a single spin defect is present, or multiple spin defects can be present). The probe is connected to the force feedback sensor either directly or indirectly via a handle structure. In order to couple the spin defect to a microwave field in an efficient and robust manner, the sensor device comprises an integrated microwave antenna arranged at a (minimal) distance of 1 to 500 micrometers from the spin defect. Preferably the distance is less than 200 micrometers.

By connecting the probe to a force feedback sensor, the sensor device is configured for use in a scanning probe microscope, thereby enabling the imaging of properties to which the spin defect is sensitive. By integrating the microwave antenna into the sensor device, the antenna will always be in a defined position relative to the spin defect. Complicated procedures of positioning and calibrating an external antenna, as necessary in the prior art, are avoided.

The sensor device can be configured as a self-contained exchangeable cartridge that can be connected to a sensor mount of a scanning probe microscope. In this manner it becomes possible to easily exchange the sensor device without the need of subsequent repositioning and recalibration of the antenna.

Advantageously the probe is made of a diamond material, and the spin defect is an NV center. However, other probe materials with spin defects, in particular, spin defects that can be spin-polarized by irradiating light, can be envisaged. In particular, the probe material can be SiC or a rare-earth doped crystal.

The probe can comprise a tip defining a distal free end, in the following also referred to as an "apex". The free end defines a sensing surface of the probe tip. In operation, the sensing surface will be brought into close proximity to a sample surface. The spin defect is embedded in the material of the probe tip within 100 nanometers from the sensing surface, better within 50 nm, preferably within 20 nm, more preferably within 10 nm from the sensing surface. In some embodiments, the tip can be configured as a pillar. The tip can, in particular, have the shape of a truncated cone tapering towards the distal free end of the tip. In such cases, the sensing surface will be a flat, essentially circular surface. However, the sensing surface does not necessarily need to be flat, but it can also have other shapes, e.g. be rounded or sharply pointed. Advantageously, the tip has a length between 1 and 5 micrometers. Advantageously, the lateral dimensions of the sensing surface are below 500 nm, more preferably below 200 nm. In particular, if the free distal end of the tip defines a flat circular sensing surface, the sensing surface preferably has a diameter of less than 500 nm.

The probe can further comprise a flat slab of a probe material, e.g. of diamond material, the tip being formed on the flat slab. The flat slab defines a bottom surface and a top surface, and the tip protrudes from the bottom surface of the flat slab. Such a flat slab with a protruding tip can readily be produced by standard photo- and electron lithographic methods. For diamond, a method of manufacture is described, e.g., in the above-mentioned document WO 2014/051886 A1, paragraphs [0116]-[0121], where the slab is called a platform, and the tip is called a nanopillar. The disclosure of said document is included herein by reference in its entirety for teaching a method of manufacture of a probe comprising a flat slab of diamond on which a tip is formed.

As already mentioned, in some embodiments the probe is connected to the force feedback sensor via a handle structure. The handle structure can have a distal end defining a flat mounting surface for the probe. If the probe comprises a flat slab, the top surface of the flat slab is bonded to the flat mounting surface of the handle structure.

The handle structure can form a thin, flat arm. It preferably has a planar, flat, sheet-like shape of essentially constant thickness. The carrier can also have a generally planar shape. In this case the plane defined by the handle structure is preferably perpendicular to the plane defined by the carrier. In particular, if the plane defined by the carrier is designated as a horizontal plane, the handle structure preferably defines a vertical plane. The mounting surface at the distal end of the handle structure is perpendicular to the plane defined by the handle structure as a whole, i.e., the mounting surface is formed on a narrow end face of the sheet-like handle structure. In particular, the mounting surface can be parallel to the plane defined by the carrier. The handle structure is configured to bridge the large dimensional gap between the dimensions of the carrier and the dimensions of the probe. It can taper from the force feedback sensor towards the probe, i.e. its width can decrease from its proximal end to its distal end. At its proximal end, the handle structure can be attached to the force feedback sensor by bonding one of the flat main surfaces of the handle structure to a lateral side face of the force feedback sensor. The handle structure preferably has a length between 0.2 and 5 millimeters.

The handle structure is preferably produced by photo- and/or electron lithographic patterning of a wafer. Accordingly, the handle structure can be made of any material that can be patterned by lithographic processing, in particular of any material that is available as a wafer, preferably in the form of a thin layer on a carrier substrate. Suitable materials for the handle structure include, without limitation, silicon, preferably single-crystalline silicon, GaAs, Sapphire, glass, and Germanium. For instance, the handle structure can be produced from a device layer of a silicon-on-insulator (SOI) wafer. By employing lithographic methods, the flat mounting surface of the handle structure can be manufactured with high precision and with a defined orientation. This significantly simplifies the mounting of the probe to the handle structure in a defined orientation, in particular as compared to prior-art solutions in which a handle structure made of a drawn glass fiber is employed.

The force feedback sensor (which may also be designated as a distance sensor) can be a piezoelectric force feedback sensor. Such sensors are known per se. They generate a piezoelectric signal in response to small deflections of a portion of the sensor from an equilibrium position. The force feedback sensor can be arranged to operate in tapping mode (allowing deflections towards and away from a sample surface) or in shear mode (allowing deflections parallel to a sample surface). In particular, the force feedback sensor can be a tuning fork sensor. In other embodiments, the force feedback sensor can be a cantilever. Instead of a piezoelectric sensor, also other types of sensors can be employed. For instance, deflections of a portion of the sensor, e.g. of a cantilever, can be detected optically by detecting deflections of a laser beam reflected from the respective sensor portion. In principle, any type of force feedback sensor that is suitable for use in scanning force microscopy can be employed.

In some embodiments, the microwave antenna comprises a wire, the wire being attached to the carrier, to the force feedback sensor, to the handle structure or to the probe. If the microwave antenna comprises a wire, a typical value for the minimal distance between the wire and the spin defect can be, e.g., 50 to 150 micrometers.

The carrier can form two parallel distal arms protruding in a distal direction, defining a slot between them. The antenna, which can be in the form of a thin wire, can be attached to the distal arms, traversing the slot between the arms.

In some embodiments, the microwave antenna comprises a conductor that has been lithographically patterned onto at least one of the following structures: the carrier; the force feedback sensor; the handle structure; the probe; and/or a separate dielectric substrate connected to the carrier, to the force feedback sensor, to the handle structure, or to the probe. If the microwave antenna comprises a conductor that has been lithographically patterned onto a separate dielectric substrate, the distance between the conductor and the spin defect can be more easily controlled than for a wire and can therefore more easily be made small. For instance, the minimal distance can be 10 to 100 micrometers. If the microwave antenna comprises a conductor that has been lithographically patterned onto the probe, the distance between the conductor and the spin defect can be further minimized and can have a value in the range of, e.g., 1 to 50 micrometers.

The microwave antenna can be resonant with the excitation frequency. In some embodiments, the microwave antenna contains high-$\epsilon$ and/or high-$\mu$ materials. High-$\epsilon$ materials are materials with a relative permittivity greater than 10. High-$\mu$ materials are materials with a relative magnetic permeability greater than 5.

The sensor can further comprise a feed line structure for feeding a DC or AC electric current in the radiofrequency or microwave frequency range, in particular in the range between 0 and 20 GHz, to the microwave antenna. The feed line structure can form a microstrip waveguide, a coplanar waveguide or any other arrangement for efficient RF or microwave transport. The microwave antenna can be coupled to the feed line structure via ohmic coupling (i.e., via direct electrical contacts), via capacitive coupling or via inductive coupling.

The feed line structure can comprise at least one conductor that has been lithographically patterned onto at least one of the following structures: the carrier; the force feedback sensor; the handle structure; and/or the probe.

In advantageous embodiments, the carrier is configured as a flat chip. One end of the carrier can be configured for connection to a sensor mount of a scanning probe microscope. To this end, the sensor device can comprise a plurality of contact pads for establishing electrical contact to at least one of the force feedback sensor and the feed lines for the microwave antenna.

The present invention further provides a scanning probe microscope comprising a sensor device as described above and a microscope head comprising a sensor mount for mounting the sensor device to the microscope head. The sensor device is then removably held in the sensor mount, allowing for easy exchange of the sensor device. The microscope head comprises a positioning device (e.g., an XY or XYZ stage) that permits relative motion (in particular, scanning motion in at least two dimensions) between the probe and a surface of a sample.

The scanning probe microscope can further comprise at least one of the following:
- a distance controller for controlling a distance between the probe and the surface of the sample, an input of the distance controller receiving signals from the force feedback sensor, and an output of the distance controller being connected to the positioning device;
- a microwave transmitter for supplying microwaves to the microwave antenna;
- an optical excitation source configured to generate excitation light for optically exciting the spin defect; and
- a photodetector configured to detect fluorescent light emitted from the spin defect.

In some embodiments, the microwave transmitter can be configured to supply microwaves at a frequency that corresponds to a resonance frequency of the microwave antenna.

The scanning probe microscope can be employed in a method of optically detecting magnetic resonance as follows:
- operating the optical excitation source to expose the spin defect to excitation light so as to spin-polarize the spin defect;
- operating the pulsed microwave transmitter to expose the spin defect to microwave radiation so as to manipulate a spin state of the spin defect;
- operating the optical excitation source to expose the spin defect to excitation light so as to optically excite the spin defect; and
- operating the photodetector to detect fluorescent light from the spin defect.

While the above protocol represents a particularly simple way of optically detecting magnetic resonance, more complicated protocols can be employed, including protocols that employ sophisticated microwave pulse sequences for manipulating the spin state of the spin defect.

BRIEF DESCRIPTION OF THE DRAWINGS

Preferred embodiments of the invention are described in the following with reference to the drawings, which are for the purpose of illustrating the present preferred embodiments of the invention and not for the purpose of limiting the same. In the drawings, FIG. 1 shows a sensor device according to a first embodiment; (a) top view; (b) side view;

FIG. 2 shows a schematic illustration of the relative arrangement of the scanning probe and the antenna in a sensor device according to the first embodiment;

FIG. 3 shows a magnified schematic illustration of the handle structure and the scanning probe of the sensor device; inset A: magnification of tip portion;

DESCRIPTION OF PREFERRED EMBODIMENTS

Figure 4:
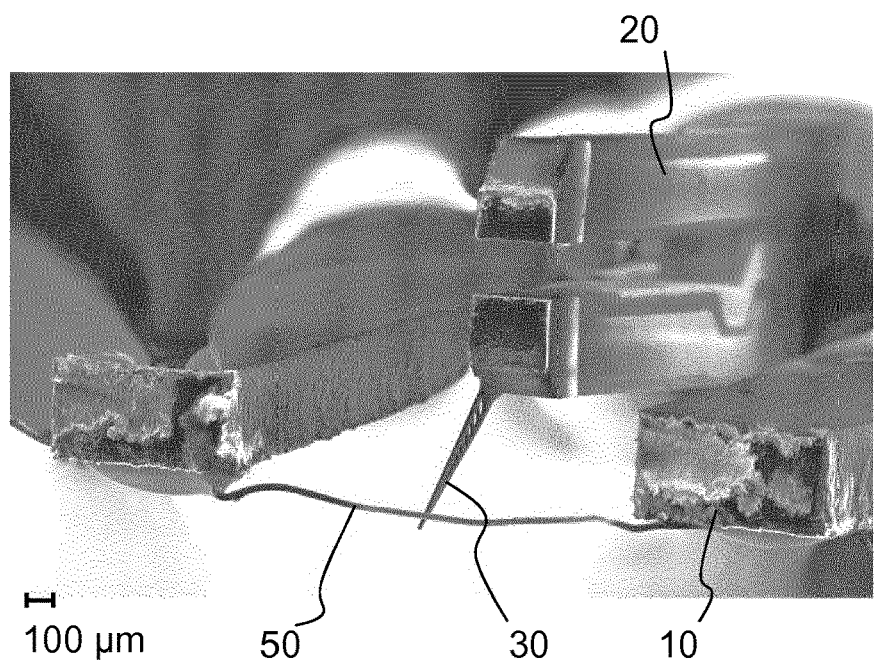
FIG. 4 shows a scanning electron micrograph of the distal end of the sensor device of the first embodiment, without the scanning probe attached.

A first embodiment of a sensor device according to the present invention is illustrated in FIGS. 1-6. The sensor device is configured as an exchangeable cartridge that forms a self-contained unit for use in a scanning probe microscope.

As apparent from FIG. 1, the sensor device comprises a carrier 10 in the form of a flat chip made of a dielectric material, e.g., of alumina. The carrier 10 has a proximal end 11 configured for connection to a correspondingly designed sensor mount of a scanning probe microscope. To this end, the carrier 10 forms two parallel proximal arms 13 protruding in the proximal direction, defining a slot of width G between them. The carrier 10 further has a distal end 12. In the region of its distal end 12, the carrier 10 forms two parallel distal arms 14 protruding in the distal direction, defining a slot of width g between them. The outer contour of the carrier 10 tapers towards the distal end over approximately half of its length. Thereby the width w of the carrier 10 at its distal end 12 is smaller than its width W at the proximal end 11. As apparent from FIG. 2, the carrier has constant thickness D. The carrier defines a horizontal plane.

The sensor device further comprises a force feedback sensor 20 in the form of a piezoelectric tuning fork sensor. In the present embodiment, the tuning fork sensor is arranged to be operated in tapping mode, i.e., the vertical plane defined by the two prongs of the tuning fork is perpendicular to the horizontal plane defined by the carrier 10. The tuning fork sensor is electrically connected to electrically conducting readout lines 15 that have been patterned onto the surface of the carrier 10 by known patterning techniques.

A thin handle structure 30 made of silicon is attached to the free end of one of the two prongs of the tuning fork sensor. The handle structure is illustrated in greater detail in FIGS. 2 and 3. The handle structure 30 has the shape of a thin, flat arm extending in a vertical plane that is generally perpendicular to the horizontal plane of the carrier and, in the present embodiment, parallel to the vertical plane defined by the two prongs of the tuning fork sensor. In the present embodiment, the proximal end of the handle structure 30 is bonded to a side face of the lower prong of the tuning fork sensor. At the distal end of the handle structure 30, a horizontal mounting surface 31 is formed. By manufacturing the handle structure 30 from a wafer material like silicon in a photolithographic process, it is possible to provide an extremely well-defined, flat mounting surface 31 with minimal roughness.

A probe 40 made of diamond is attached to the distal free end of the handle structure 30. The probe is illustrated in greater detail in FIG. 3. It comprises a flat slab 41 of diamond material with a flat bottom surface 42 and a flat top surface 43. The top surface 43 is bonded to the mounting surface 31 of the handle structure. Due to the excellent planarity of the mounting surface 31 and of the top surface 43, the probe 40 will always be attached to the handle structure 30 in a readily reproducible, well-defined orientation. A small tip 44 of diamond material, having the form of a frustoconical pillar, protrudes from the bottom surface 42. At its free end, the tip 44 defines a sensing surface 45, which in the present example is flat and has circular shape. The tip 44 comprises a spin defect 46 in the form of an NV center, which is situated in the tip material within 100 nm or less from the sensing surface, e.g., about 10 nm from the sensing surface.

An antenna 50 in the form of a thin wire is attached to the distal arms 14 of the carrier 10, traversing the distal slot between the arms. The antenna passes the sensing surface 45 of the tip 44 (and therefore the spin defect 46) within less than 500 micrometers, e.g., within 50-150 micrometers in the present example where the antenna is formed by a wire. The antenna is electrically connected to feed lines 16 on the top of carrier 10 for feeding microwave radiation to the antenna. The feed lines 16 have been patterned onto the carrier by known patterning techniques, e.g. lithographic techniques or other pattern transfer techniques. At its proximal end, each feed line 16 defines a contact pad 17 for connection to a microwave transmitter. Likewise, each readout line 15 defines a contact pad at its proximal end. In the present embodiment, the antenna 50 is coupled to the feed lines 15 via an ohmic connection, i.e., the antenna directly electrically contacts the feed lines to feed the current to the antenna.

The diameter of the wire that forms the antenna can vary in a wide range. For instance, the wire may have a diameter between less than 1 micrometer and more than 100 micrometers. The antenna does not necessarily have to be a wire. More generally the antenna may, e.g., consist of a wire, strip or pattern of a conductive material like Al, Au or Cu in a wide range of sizes, e.g. having a width between 50 nm and 300 micrometers.

A sensor device according to the first embodiment was manufactured as follows.
a) The carrier chip was cut to size. Size was 14—5.1×0.4 mm$^3$, and the material was alumina.
b) Electrical readout lines for the piezoelectric force feedback sensor and feed lines for microwave transmission were patterned onto the chip surface.
c) The microwave antenna was bonded to the feed lines. In the present example, the antenna was a wire of 25 micrometers diameter. The antenna was attached in such a manner that it passed within about 130 micrometers from the spin defect.
d) The piezoelectric force feedback sensor was affixed to the chip. In the present example, the force feedback sensor was a quartz tuning fork.
e) The handle structure was affixed to the force feedback sensor. The handle was lithographically fabricated from silicon. It had sub-millimeter size. The shape and size of the handle were tailored to precisely adjust the tilt of the probe, to ensure unblocked optical access to the probe, and to interface with the electromagnetic antenna.
f) A probe in the form of a diamond slab with a diamond tip was affixed to the handle. The diamond tip contained one or several NV centers near the free end of the tip.

Optionally, further electrically conducting elements can be patterned on either the handle, the diamond slab, or both. These elements may serve to enhance the electromagnetic field at the locus of the NV center.

Figure 5:
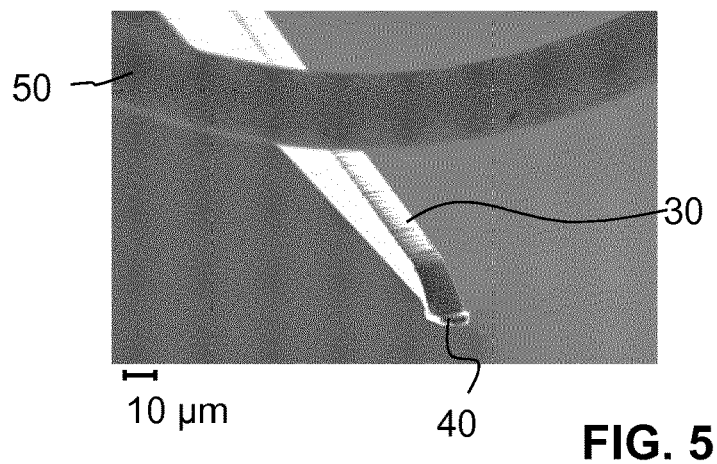
FIG. 5 shows a magnified view of the handle structure, the scanning probe and the antenna.
Figure 6:
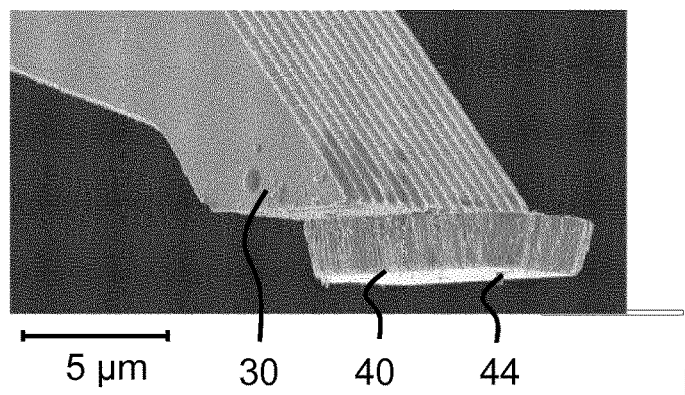
FIG. 6 shows a scanning electron micrograph of the handle structure and the scanning probe.

Electron micrographs of the actual sensor device are shown in FIGS. 4-6. These images illustrate the large dimensional difference between the dimensions of the carrier and the force feedback sensor (in the millimeter range) and the tip (in the micrometer range). The handle structure aids in bridging this large dimensional gap.

In the exemplary embodiment, dimensions of the carrier were as follows: overall length of carrier, L=14 mm; width of carrier at proximal end, W=5.1 mm; width of proximal slot, G=1.5 mm; width of carrier at distal end, w=3 mm; width of distal slot, g=1.5 mm; length of proximal portion having constant width, P=7 mm; thickness of carrier, D=0.4 mm. Dimensions of the probe were as follows: length of slab, 5 to 20 micrometers; thickness of slab, 2.5 micrometers; length of tip (measured between bottom surface of slab and free end of tip), 2 micrometers; diameter of tip at base of tip, 0.9 micrometers; diameter of sensing surface at free end of tip, 0.2 micrometers.

While in the above-described embodiment the carrier has the shape of a flat chip, it is to be understood that shape, layout and dimensions of the carrier can vary in wide ranges. The length of the carrier is preferably less than 100 mm, more preferably less than 50 mm. The maximum width of the carrier is preferably less than 20 mm, more preferably less than 10 mm. The thickness of the carrier is preferably less than 2 mm, more preferably less than 1 mm.

The shape and dimensions of the probe can also vary. In particular, the tip does not need to be formed on a slab and does not need to have the shape of a truncated cone. For instance, in other embodiments, the tip can have a rounded free end or can be sharply pointed.

Figure 7:
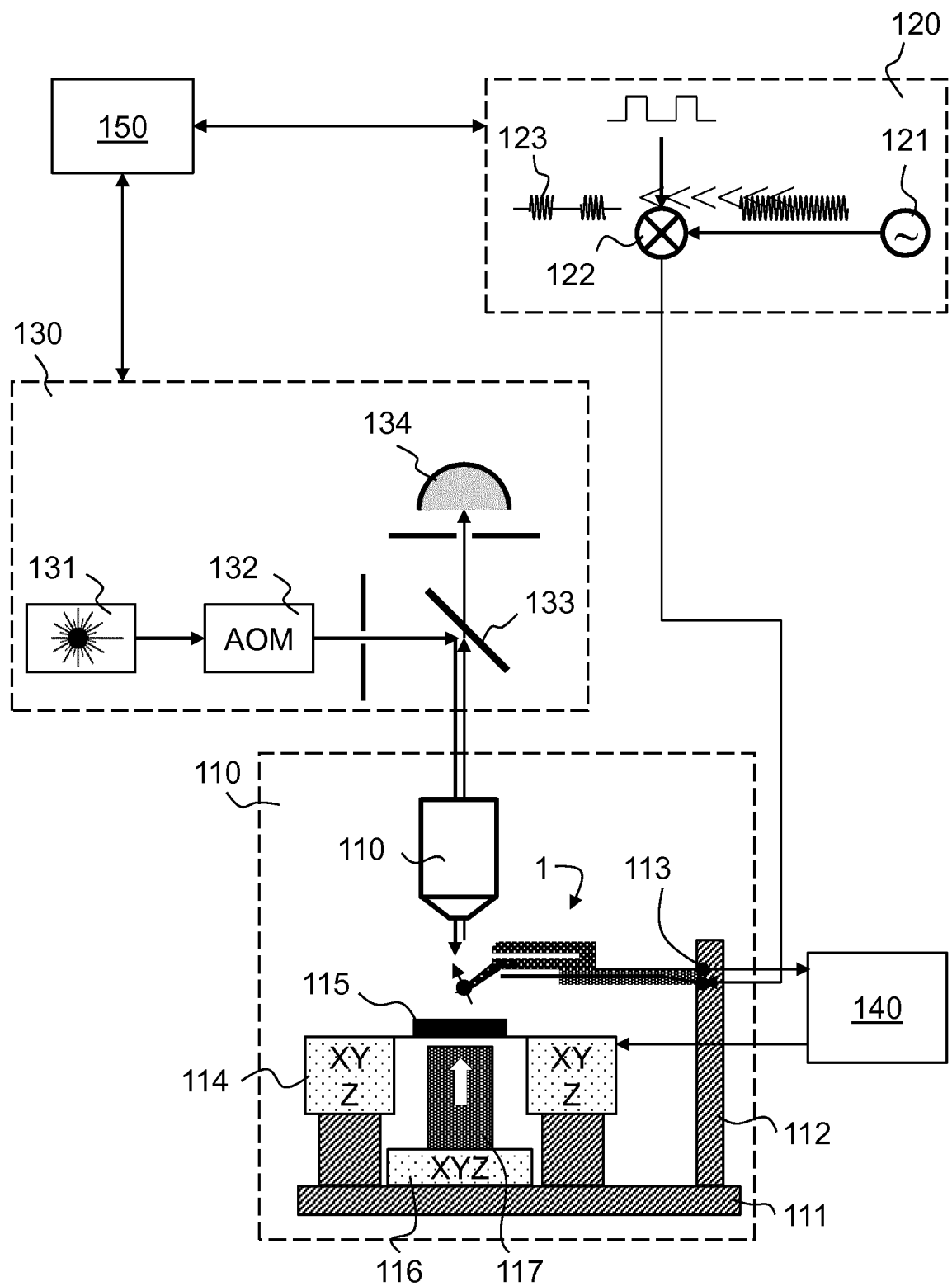
FIG. 7 shows a highly schematic view of a scanning probe microscope employing the sensor device of the first embodiment.

FIG. 7 illustrates, in a highly schematic manner, a complete scanning probe microscope (SPM) setup including the sensor device. The setup comprises a microscope head 110, a microwave transmitter 120, an optics setup 130, an SPM controller 140 and an ODMR controller 150.

The microscope head 110 comprises a base 111 and a sensor mount 112 configured to receive the proximal end 11 of the carrier 10. The sensor mount 112 comprises contacts 113 for establishing electrical connections to the contact pads 17 on the carrier 10. The microscope head further comprises a first positioning device 114 in the form of a scanning stage, on which a sample 115 is held, and a second positioning device 116, on which a permanent magnet 117 is held. In addition, the microscope head 110 comprises an objective 118 focused onto the free end 45 of the probe tip 44 through the (optically transparent) slab 41 and through the probe tip itself. In other embodiments, the microscope head can be configured to image the probe tip from below. In this case the slab would not have to be transparent.

The microwave transmitter 120 comprises a continuous (cw) microwave source 121 for generating an AC voltage in the range of typically 0-20 GHz, and a pulse shaper 121 for creating microwave pulses 123.

The optics setup 130 comprises a laser 131, an acousto-optic modulator (AOM) 132, a semitransparent mirror 133, and a photodetector 134.

The SPM controller 140 interfaces with the force feedback sensor 20 and the first positioning device 114 to control the distance between the probe tip 44 and the surface of the sample 115 in a manner known per se, and to scan the probe tip 44 over the surface of the sample. The SPM controller further interfaces with the second positioning device 116 to adjust the position of the permanent magnet 117, so as to vary the external static magnetic field to which the sample is exposed.

The ODMR controller 150 interfaces with the microwave transmitter 120 and with the optical setup 130 to excite and optically polarize the spin defect, to manipulate the spin state of the spin defect, and to record fluorescent light emitted by the spin defect.

The scanning sensor is operated using the following procedure:
a) The sensor chip is mounted in the scanning probe microscope.
b) The readout lines of the piezoelectric force feedback sensor are connected to the SPM controller 140.
c) The microwave transmission lines are connected to the microwave transmitter 120.
d) The fluorescence of the diamond probe is measured while the probe is scanned over a sample surface of interest. Continuous (cw) or pulse microwave fields are applied to manipulate the spin defect, so as to perform a desired measurement. In addition, DC or low frequency electric or magnetic fields may be applied.

Figure 8:
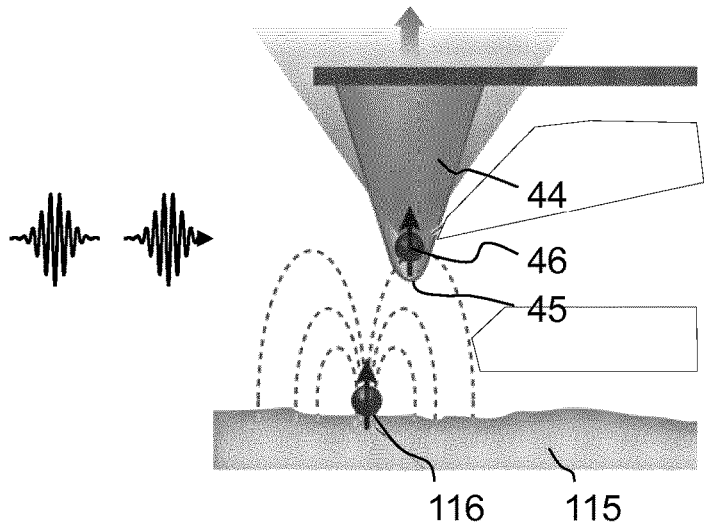
FIG. 8 shows a sketch that illustrates the physical principle of the sensor device (adapted from R. Schirhagl, K. Chang, M. Loretz, and C. L. Degen, Nitrogen-vacancy centers in diamond: Nanoscale sensors for physics and biology, Annu. Rev. Phys. Chem. 65, 83 (2014)

FIG. 8 illustrates the operational principle of the sensor device. The spin state of the spin defect 46 is influenced by a magnetic field, which in turn is influenced by magnetic structures 116 at or near the surface of the sample 115

Figure 9:
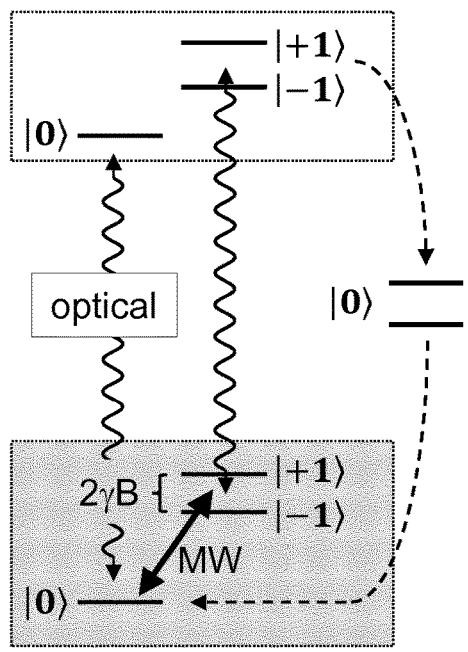
FIG. 9 shows an energy level diagram for a nitrogen-vacancy center.

FIG. 9 is an energy level diagram of an NV center. An NV center is a point defect in the diamond lattice. It consists of a nearest-neighbor pair of a nitrogen atom, which substitutes for a carbon atom, and a lattice vacancy. NV centers can be produced by ion implantation with nitrogen ions. NV centers can also be produced from single substitutional nitrogen centers (P1 centers) by irradiation with high-energy radiation such as electron, proton, neutron, ion or gamma irradiation. The P1 centers can be either native or within a purposely grown doped layer at the diamond surface. In both method, NV centers are formed from P1 defects and vacancies by an annealing process. An NV center in the negative charge state comprises an unpaired nitrogen electron and an extra electron, which together form a spin S=1 pair. In the present disclosure, all references to NV centers are to be understood as meaning NV centers in the negative charge state (sometimes also called [NV-] centers in the literature). One important property of NV centers is that close to 100% electron spin polarization can be created by optically pumping the NV centers with green laser light, causing the NV centers to be driven into the $m_s=0$ substate of the ground state.

Figure 10:
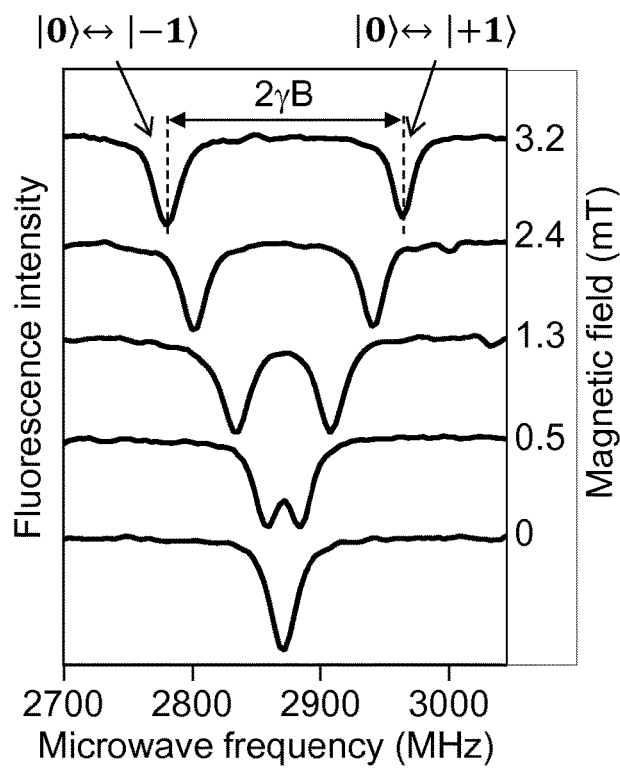
FIG. 10 shows optically detected magnetic resonance spectra of a nitrogen-vacancy center at different magnetic fields.

The ground state is a spin one (S=1) triplet. In the absence of a magnetic field, the triplet is split into an $m_s=0$ and two degenerate $m_s=\pm 1$ sublevels. The $m_s=0$ and $m_s=\pm 1$ are separated by a $\Delta=2.87$ GHz zero field splitting. By irradiating green laser light, the excited state is populated. The system returns to the ground state by fluorescence. The electronic transition is spin-preserving. The $m_s=\pm 1$ substate of the excited can in addition return to the $m_s=0$ substate of the ground state via a dark intermediate state. In this manner, the $m_s=0$ substate becomes preferentially populated. A further consequence is that fluorescence of the $m_s=0$ transition is brighter than for the $m_s=\pm 1$ transition. Microwave excitation at the resonance frequency manipulates the spin states and thereby causes a fluorescence drop. A static magnetic field causes a Zeeman splitting between $m_s=\pm 1$ substates. The degeneracy of the $m_s=\pm 1$ states is thus lifted, and the electron spin resonance spectrum contains two resonance lines, one shifted to the higher and the other shifted to the lower frequency (see FIG. 10). By measuring the frequency difference $2\gamma B$ between the resonances, the magnitude of the external field can be calculated. The NV center has a preferred axis, given by the principal axis of the zero field splitting tensor and corresponding to the (111) crystallographic axis. B is the component of the vector magnetic field that is parallel to the NV principal axis.

It has also been shown that NV centers can be used to measure temperature (V. M. Acosta, E. Bauch, M. P. Ledbetter, A. Waxman, L. S. Bouchard, and D. Budker, Temperature dependence of the nitrogen-vacancy magnetic resonance in diamond, Phys. Rev. Lett. 104, 070801 (2010)) and electric fields (Nature Physics Volume 7, Pages 459-463 (2011)).

In more detail, measurements are carried out as follows:
a) The spin defect 46 (a nitrogen-vacancy center) is exposed to green laser light. This polarizes the spin defect within 1 microsecond.
b) The spin defect 46 is exposed to cw or pulsed microwaves 123 of a defined frequency $\omega$. If this frequency matches a resonance frequency $\omega_0$ of the spin defect, the spin state of the spin defect is manipulated.
c) The resulting spin state is measured using a second laser pulse and fluorescence detection. Fluorescent light from the spin defect is read out through the diamond material of the probe. The diamond material thus acts as an optical outcoupling structure for the fluorescent light, which guides the fluorescent light towards an output end of the outcoupling structure. In the present case, the top surface of the probe forms the output end. The recorded signal is the fluorescence intensity, which depends on the spin state.
d) The resonance frequency $\omega_0$ is very specific. It shifts with field as $\omega_0=2870$ MHz$\pm(B/1$ mT$)*28.0$ MHz. By measuring $\omega_0$, the local magnetic field is measured. The local magnetic field can, e.g., be influenced by a magnetic moment on the sample surface. The spin state can also be influenced by other parameters such as an electric field, causing a Stark shift, or temperature, causing variations of axial zero-field splitting.
e) 2D or 3D scanning is used to measure the magnetic field or other parameters as a function of position.
f) The spatial resolution is roughly given by the sensor-to-surface distance, which can be <20 nm.

g) By using sophisticated microwave pulse sequences, different details of the magnetic sample surface can be probed (like, a frequency spectrum).

In summary, the above disclosure can be characterized as relating to a novel scanning probe that uses quantum metrology for enhanced sensitivity and spatial resolution. The system consists of a diamond tip with one or several defect spins (such as nitrogen-vacancy centers, or NV centers) at its free end, a distance sensor, and a microwave antenna. These elements are integrated on a single carrier, which preferably has the form of a chip. The carrier moreover contains suitable electrical connections to efficiently and conveniently operate the distance sensor and microwave antenna. For performing a measurement, the sensing surface of the tip is positioned within 500 nm, better within 200 nm, more preferably within 100 nm from the investigated sample surface while the spin resonance of the defect spin is analyzed using optical and microwave pulses. Advantageously the distance between the sensing surface and the sample surface is as small as possible, ideally less than 10 nm. In practice, distances between 25 and 100 nm have already been achieved. In this way, magnetic, electrical, thermal or other properties of the surface can be detected and imaged with <100 nm, and possibly <10 nm spatial resolution. In addition, the frequency characteristics of signals can be analyzed. Measurements can be carried out at any temperature from 0-400 K, and in particular at room temperature. Since the sensor consists of a single, atom-like magnetic impurity, magnetic back-action on the sample is negligible (in contrast to other probes, such as magnetic force microscopy tips). The combination of the above features greatly enlarges the range of samples and phenomena that can be studied at the nanoscale.

Figure 11:
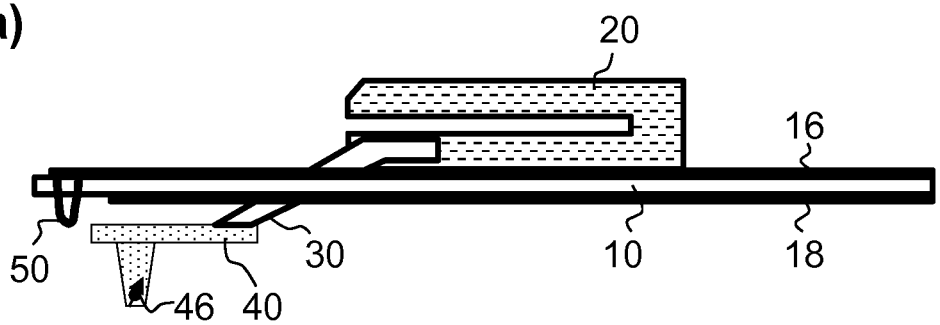
FIG. 11 shows a functional sketch of the sensor device according to the first embodiment; (a) top view; (b) side view.
Figure 11:
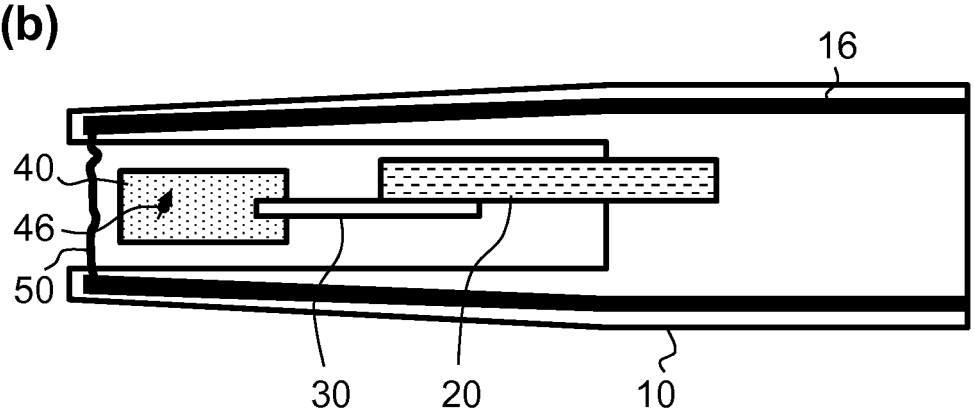

FIG. 11 is a functional sketch of the sensor device according to the first embodiment, wherein the relative dimensions of the different components of the sensor device are deliberately drawn not to scale. In particular, the size of the probe is greatly exaggerated in relation to the size of the carrier, the force feedback sensor, and the handle structure. This sketch is provided in order to enable a more direct comparison of the design of the first embodiment to the designs of the further embodiments that will be discussed in the following. For simplicity the readout lines are not shown in the sketch.

As illustrated in FIG. 11, the bottom side of the carrier 10 can be provided with an electrically conducting layer 18 forming a ground plane for the microwave feed lines 16 and for the readout lines. As discussed above, the antenna 50 is a piece of wire passing in close proximity to the NV centers. Contact between the antenna and the microwave feed line are ohmic. The feed lines can form a microstrip waveguide, a coplanar waveguide or another arrangement for efficient microwave transport.

FIGS. 12 to 17 are functional sketches of sensor devices according to a second to seventh embodiment. In all these sketches, relative dimensions between the various components are not to scale.

Figure 12:
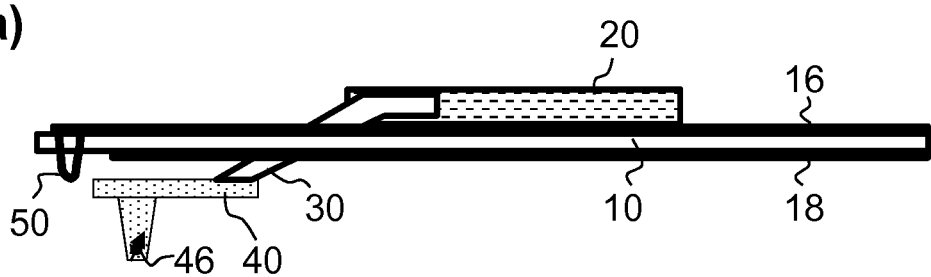
FIG. 12 shows a functional sketch of a sensor device according to a second embodiment; (a) top view; (b) side view.
Figure 12:
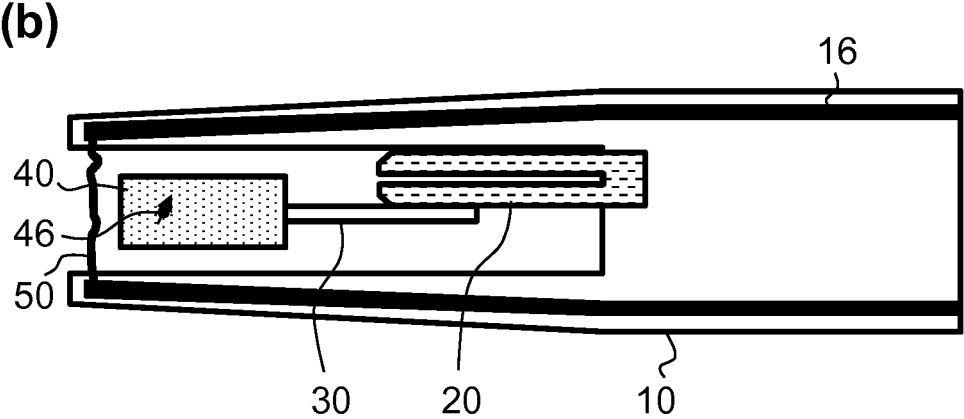

FIG. 12 is a functional sketch of a sensor device according to a second embodiment. The general setup largely corresponds to the setup of the first embodiment; however, the piezoelectric force feedback sensor 20 is mounted for operation in shear mode. To this end, the two prongs of the tuning fork are arranged in a horizontal plane rather than in a vertical plane as in the first embodiment.

Figure 13:
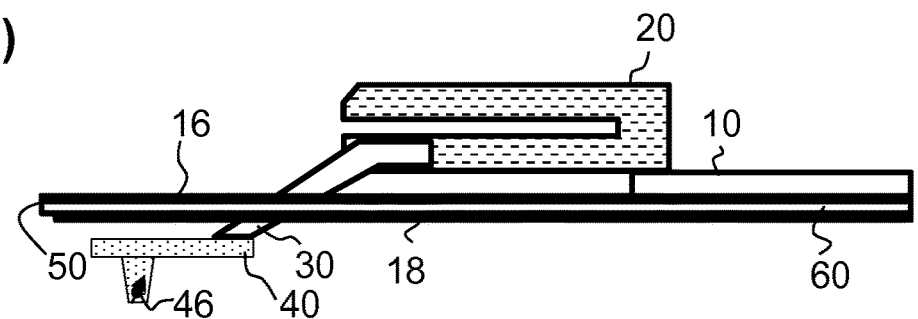
FIG. 13 shows a functional sketch of a sensor device according to a third embodiment; (a) top view; (b) side view.
Figure 13:
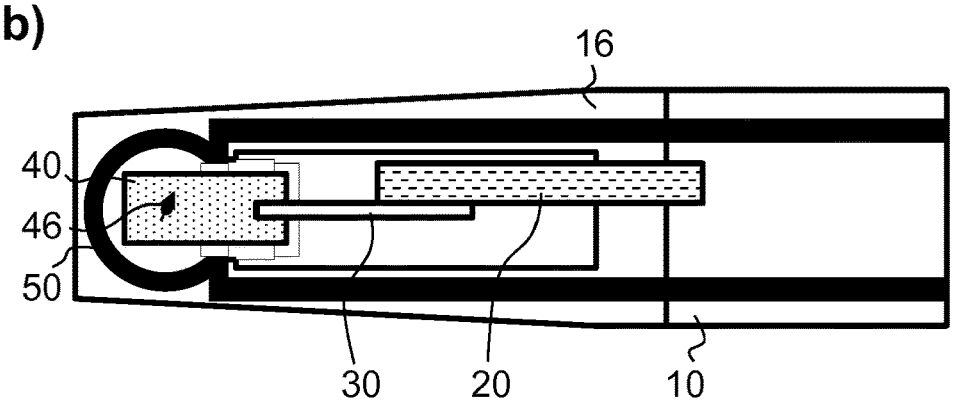

FIG. 13 is a functional sketch of a sensor device according to a third embodiment. In this embodiment, the microwave feed lines 16 and the antenna 50 are formed on a separate dielectric substrate 60 connected to the carrier 10. The dielectric substrate 60 has the shape of a flat slice extending parallel to the horizontal plane defined by the carrier 10. It has a through opening 71 allowing free access to the probe 40 from above, so as to be able to shine light on to the probe 40 from above. The feed line 16 and the antenna 50 are lithographically patterned on the dielectric substrate. As in the previous embodiment, contacts between the antenna and the microwave feed lines are ohmic. By patterning the antenna on a dielectric substrate, the impedance characteristics of the antenna and its coupling to the spin defect can be controlled in a highly reproducible manner.

Figure 14:
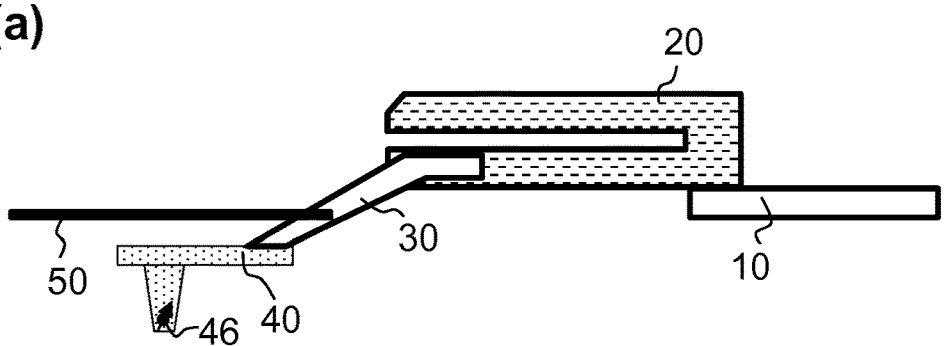
FIG. 14 shows a functional sketch of a sensor device according to a fourth embodiment; (a) top view; (b) side view.
Figure 14:
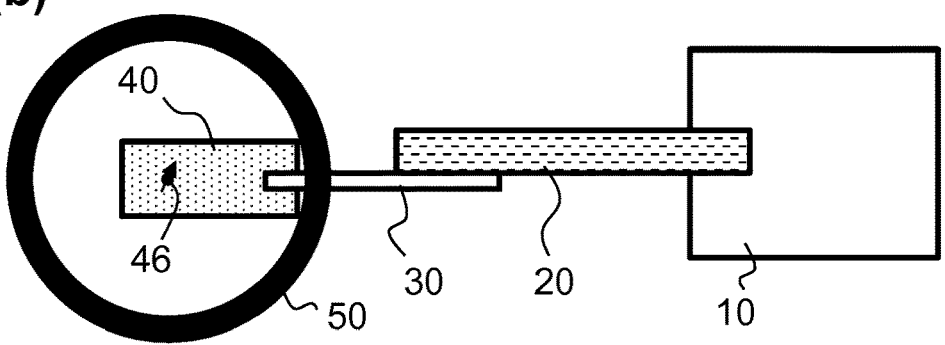

FIG. 14 is a functional sketch of a sensor device according to a fourth embodiment. In this embodiment, the antenna 50 is a planar loop passing in close proximity to the probe tip 44. The antenna 50 is attached to the handle structure 30. It can be formed by a piece of wire or can be lithographically patterned on an annular dielectric substrate. The antenna 50 can be brought closer to the spin defect than in the previous embodiments; the minimal distance between the antenna and the spin defect will typically be in the range between 10 and 100 micrometers. A microwave field is inductively coupled to the antenna 50 by means of a transmit antenna (not shown). The antenna can be part of a resonant circuit, or it can form a resonant circuit by itself. The transmit antenna can be integrated with the sensor device itself, e.g., can be arranged on the carrier 10 or on any other component of the sensor device. In other embodiments, the transmit antenna can be provided separately from the sensor device itself and can be arranged on any other structure of the scanning probe microscope setup in which the sensor device is used.

Figure 15:
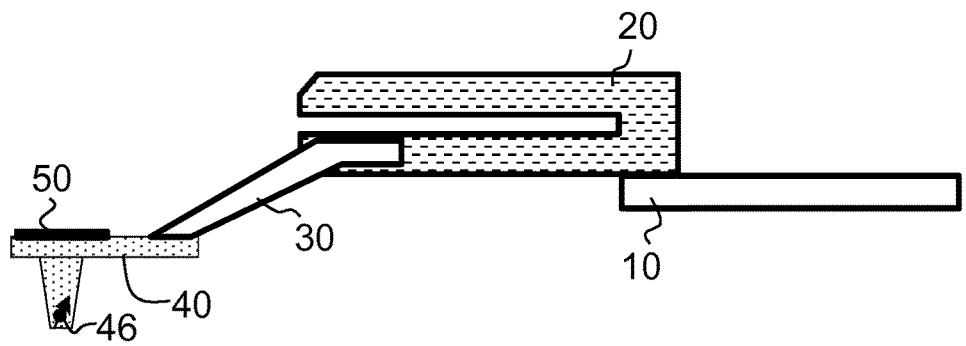
FIG. 15 shows a functional sketch of a sensor device according to a fifth embodiment; (a) top view; (b) side view.
Figure 15:
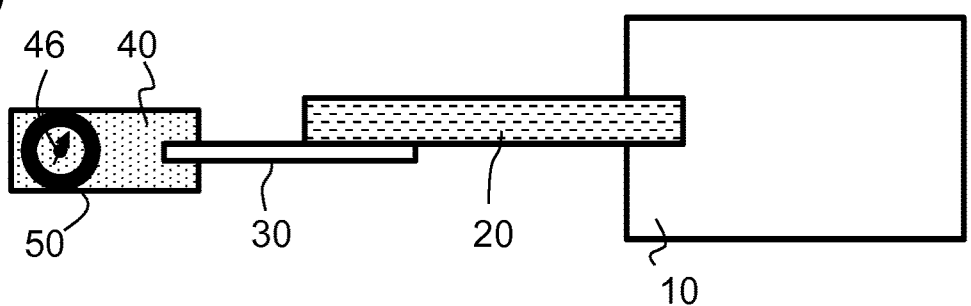

FIG. 15 is a functional sketch of a sensor device according to a fifth embodiment. In this embodiment, the antenna 50 is a planar loop formed directly on the probe 40 itself, in close proximity to the probe tip 44. By arranging the antenna directly on the probe, the distance between the antenna and the spin defect can be further minimized. For instance, in the present embodiment, the minimal distance can be chosen to be 1-50 nm. To achieve efficient coupling, the antenna may be made of or be surrounded by a high-$\epsilon$ or high-$\mu$ material. As in the previous embodiment, a microwave field is inductively coupled to the antenna 50 by means of a transmit antenna (not shown), which can be part of the sensor device itself or can be provided separately.

Figure 16:
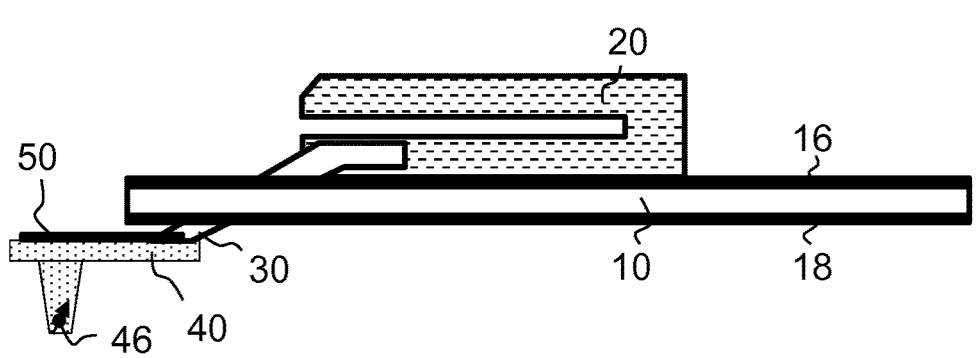
FIG. 16 shows a functional sketch of a sensor device according to a sixth embodiment; (a) top view; (b) side view.
Figure 16:
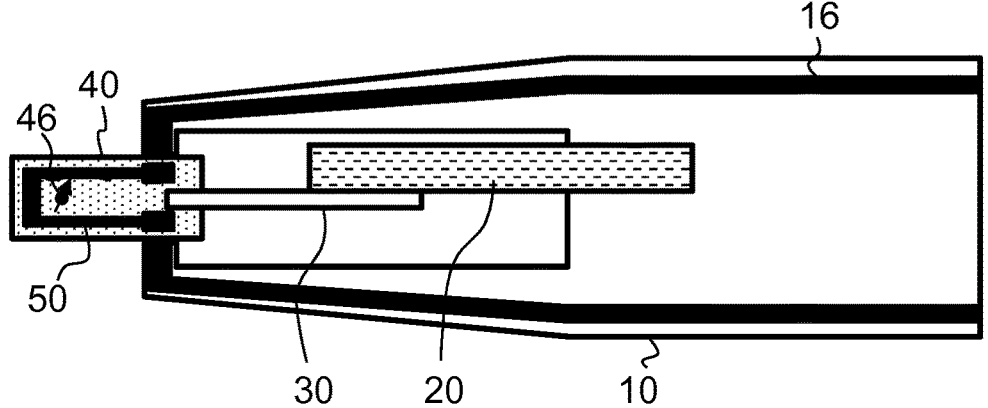

FIG. 16 is a functional sketch of a sensor device according to a sixth embodiment. As in the previous embodiment, the antenna 50 is a planar loop formed directly on the probe 40 itself, in close proximity to the probe tip 44. In contrast to the previous embodiment, however, the antenna 50 is capacitively coupled to the feed lines 16 across an air gap between the feed lines 16 and the antenna 50. In the present embodiment, the feed lines 16 are provided on the sensor device itself, in particular, on the carrier 10. In other embodiments, a feed line structure for capacitive coupling to the antenna 50 can be arranged separately from the sensor device itself.

Figure 17:
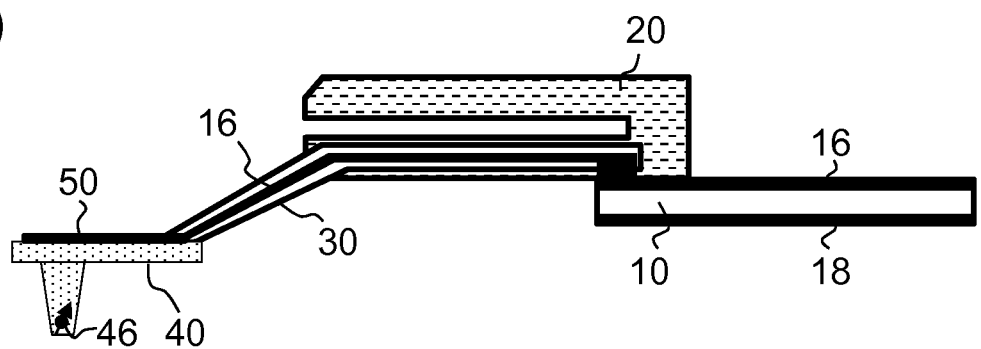
FIG. 17 shows a functional sketch of a sensor device according to a seventh embodiment; (a) top view; (b) side view.
Figure 17:
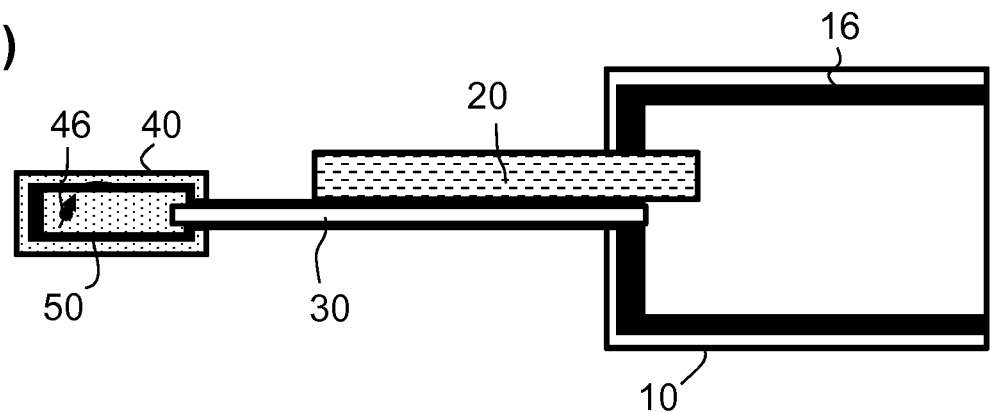

FIG. 17 is a functional sketch of a sensor device according to a seventh embodiment. As in the previous embodiment, the antenna is a planar loop formed directly on the probe 40 itself. The microwave feed lines extend from the carrier 10 via the handle structure 30 directly to the antenna 50. The antenna 50 is directly electrically connected to the microwave feed lines via an ohmic connection.

From the above examples it is apparent that many further modifications are possible without leaving the scope of the present invention.

The invention claimed is:

1. A sensor device, comprising:
   a carrier;
   a force feedback sensor connected to the carrier;
   a probe containing a spin defect, the probe being connected to the force feedback sensor either directly or indirectly via a handle structure; and
   an integrated microwave antenna arranged at a distance of less than 500 micrometers from the spin defect.

2. The sensor device of claim 1, wherein the probe is made of a diamond material, and wherein the spin defect is an NV center.

3. The sensor device of claim 1, wherein the probe comprises a tip having a free end defining a sensing surface, the spin defect being embedded in the tip within 100 nanometers from the sensing surface.

4. The sensor device of claim 1, comprising the handle structure connected to the force feedback sensor,
   wherein the probe comprises a flat slab defining a bottom surface and a top surface, the tip protruding from the bottom surface of the flat slab,
   wherein the handle structure has a distal end defining a flat mounting surface for the probe; and
   wherein the top surface of the flat slab is bonded to the flat mounting surface of the handle structure.

5. The sensor device of claim 4, wherein the mounting surface is comprised of a lithographically patterned wafer material.

6. The sensor device of claim 1, wherein the force feedback sensor is a piezoelectric force feedback sensor.

7. The sensor device of claim 1, wherein the microwave antenna comprises a wire, the wire being attached to the carrier, the force feedback sensor, the handle structure or the probe.

8. The sensor device of claim 1, wherein the microwave antenna comprises a conductor that has been lithographically patterned onto at least one of the following structures:
   the carrier;
   the force feedback sensor;
   the handle structure;
   the probe;
   a separate substrate connected to the carrier, to the force feedback sensor, to the handle structure, or to the probe.

9. The sensor device of claim 1, comprising a feed line structure for feeding an AC electric current to the microwave antenna, the microwave antenna being coupled to the feed line structure via ohmic coupling, via capacitive coupling or via inductive coupling.

10. The sensor device of claim 9, wherein the feed line structure comprises at least one conductor that has been lithographically patterned onto at least one of the following structures:
    the carrier;
    the force feedback sensor;
    the handle structure;
    the probe.

11. The sensor device of claim 1, wherein the sensor device is configured as a self-contained exchangeable cartridge.

12. The sensor device of claim 11, wherein the carrier is configured as a flat chip, one end of the carrier being configured for connection to a sensor mount of a scanning probe microscope.

13. A scanning probe microscope comprising:
    a sensor device; and
    a microscope head comprising a sensor mount for mounting the sensor device to the microscope head, the microscope head comprising a positioning device that permits relative motion between the probe and a surface of a sample, the sensor device being removably held in the sensor mount,
    the sensor device comprising:
    a carrier;
    a force feedback sensor connected to the carrier;
    a probe containing a spin defect, the probe being connected to the force feedback sensor either directly or indirectly via a handle structure; and
    an integrated microwave antenna arranged at a distance of less than 500 micrometers from the spin defect.

14. The scanning probe microscope of claim 13, further comprising:
    a distance controller for controlling a distance between the probe and the surface of the sample, the distance controller having an input for receiving signals from the force feedback sensor and an output connected to the positioning device;
    a microwave transmitter for supplying microwaves to the microwave antenna;
    an optical excitation source configured to generate excitation light for optically exciting the spin defect; and
    a photodetector configured to detect fluorescent light emitted from the spin defect.

15. A method of optically detecting magnetic resonance using a scanning probe microscope,
    the scanning probe microscope comprising a sensor device, a microscope head, a distance controller, a microwave transmitter, an optical excitation source, and a photodetector,
    the sensor device comprising a carrier, a force feedback sensor connected to the carrier, a probe containing a spin defect, the probe being connected to the force feedback sensor either directly or indirectly via a handle structure, and an integrated microwave antenna arranged at a distance of less than 500 micrometers from the spin defect,
    the microscope head comprising a sensor mount for mounting the sensor device to the microscope head and a positioning device that permits relative motion between the probe and a surface of a sample, the sensor device being removably held in the sensor mount,
    the distance controller being configured to control a distance between the probe and the surface of the sample, the distance controller having an input for receiving signals from the force feedback sensor and an output connected to the positioning device,
    the microwave transmitter being configured to supply microwaves to the microwave antenna,
    the optical excitation source being configured to generate excitation light for optically exciting the spin defect, and
    the photodetector being configured to detect fluorescent light emitted from the spin defect,
    the method comprising:
    operating the optical excitation source to expose the spin defect to excitation light so as to spin-polarize the spin defect;
    operating the pulsed microwave transmitter to expose the spin defect to microwave radiation so as to manipulate a spin state of the spin defect;
    operating the optical excitation source to expose the spin defect to excitation light so as to optically excite the spin defect; and
    operating the photodetector to detect fluorescent light from the spin defect.

16. The sensor device of claim 1,
wherein the carrier forms two parallel distal arms protruding in a distal direction, defining a slot between them, and
wherein the probe is arranged in the slot between the distal arms.

17. The sensor device of claim 16, wherein the microwave antenna is attached to the distal arms, traversing the slot between the distal arms.

18. The sensor device of claim 17, wherein the microwave antenna comprises a wire having two ends, each of the ends of the wire being attached to one of the distal arms.

19. The sensor device of claim 6, wherein the force feedback sensor is a tuning-fork sensor arranged to operate in tapping mode or in shear mode.

\* \* \* \* \*